(12) United States Patent
Oh et al.

(10) Patent No.: US 12,210,061 B2
(45) Date of Patent: Jan. 28, 2025

(54) DEEP LEARNING-BASED MLCC STACKED ALIGNMENT INSPECTION SYSTEM AND METHOD

(71) Applicant: KOREA UNIVERSITY OF TECHNOLOGY AND EDUCATION INDUSTRY-UNIVERSITY COOPERATION FOUNDATION, Cheonan-si (KR)

(72) Inventors: Heung-Seon Oh, Cheonan-si (KR); Sung Bin Son, Gumi-si (KR); Jun Uk Jung, Daegu (KR); Hyun Jae Kim, Pyeongtaek-si (KR)

(73) Assignee: KOREA UNIVERSITY OF TECHNOLOGY AND EDUCATION INDUSTRY- UNIVERSITY COOPERATION FOUNDATION, Cheonan-si (KR)

( * ) Notice: Subject to any disclaimer, the term of this patent is extended or adjusted under 35 U.S.C. 154(b) by 0 days.

(21) Appl. No.: 18/276,450

(22) PCT Filed: Nov. 1, 2022

(86) PCT No.: PCT/KR2022/016880
§ 371 (c)(1),
(2) Date: Aug. 9, 2023

(87) PCT Pub. No.: WO2023/080587
PCT Pub. Date: May 11, 2023

(65) Prior Publication Data
US 2024/0103076 A1 Mar. 28, 2024

(30) Foreign Application Priority Data
Nov. 5, 2021 (KR) .................. 10-2021-0151239

(51) Int. Cl.
*G01R 31/3183* (2006.01)
*G06N 3/00* (2023.01)
*G06N 3/08* (2023.01)

(52) U.S. Cl.
CPC ........... *G01R 31/318307* (2013.01); *G01R 31/318342* (2013.01)

(58) Field of Classification Search
CPC .... G01R 31/318307; G01R 31/318342; G06N 3/045; G06N 3/08; G06N 20/00; H01G 4/012; H01G 4/30
See application file for complete search history.

(56) References Cited

U.S. PATENT DOCUMENTS

| | | | | |
|---|---|---|---|---|
| 8,264,816 B2 * | 9/2012 | Bultitude | .............. | H01G 4/40 361/767 |
| 10,573,462 B2 * | 2/2020 | An | .............. | H01G 4/232 |

(Continued)

FOREIGN PATENT DOCUMENTS

| | | |
|---|---|---|
| CN | 108982508 A | 12/2018 |
| KR | 10-0311282 B1 | 11/2001 |

(Continued)

OTHER PUBLICATIONS

International Search Report dated Feb. 9, 2023, issued in International Patent Application No. PCT/KR2022/016880.
Written Opinion dated Feb. 9, 2023, issued in International Patent Application No. PCT/KR2022/016880.

*Primary Examiner* — Justin R Knapp
(74) *Attorney, Agent, or Firm* — PnK IP LLC (57) ABSTRACT

A deep learning-based MLCC stacked alignment inspection system includes an integrated defect detection unit configured to detect core areas requiring inspection of image data in which a stacked structure is photographed from a semiconductor MLCC chip by using at least one deep learning-based core area detection model, perform segmentation in (Continued)

the detected core areas, determine whether a defect exists according to a standard margin percentage range, and enable defect detection by generating normal and/or defective data based on the determination result, a result analysis unit configured to perform visualization for respective results of the core area detection, segmentation, and defect detection of the integrated defect detection unit, and provide stepwise analysis data for the visualized respective results so as to determine whether to modify corresponding data, and a data storage configured to store the normal and/or defective data, and stepwise analysis data.

8 Claims, 9 Drawing Sheets

(56) References Cited

U.S. PATENT DOCUMENTS

| | | | |
|---|---|---|---|
| 11,394,104 B2* | 7/2022 | Min | H01Q 1/2283 |
| 2018/0068794 A1* | 3/2018 | Lee | H01G 4/236 |

FOREIGN PATENT DOCUMENTS

| | | |
|---|---|---|
| KR | 10-2011-004929 | 1/2011 |
| KR | 10-2014-0082095 A | 7/2014 |
| KR | 10-2019-0063839 A | 6/2019 |
| KR | 10-2021-0122030 A | 10/2021 |
| WO | 2023/080587 | 5/2023 |

* cited by examiner

FIG. 3 result analysis system

Prior Art

FIG. 10

Prior Art

FIG. 11

DEEP LEARNING-BASED MLCC STACKED ALIGNMENT INSPECTION SYSTEM AND METHOD

CROSS REFERENCE TO RELATED APPLICATION

This application is a National Stage Entry of International Patent Application No. PCT/KR2022/016880, filed on Nov. 1, 2022, which claims priority from and the benefit of Korean Patent Application No. 10-2021-0151239, filed on Nov. 5, 2021, each of which is hereby incorporated by reference for all purposes as if fully set forth herein.

BACKGROUND

Field

Embodiments of the invention relate generally to an MLCC stacked alignment inspection system and a method thereof and, more specifically, to a deep learning-based MLCC stacked alignment inspection system and a method thereof, wherein core areas of a deep learning-based model for a captured image are detected and a segmentation result is used, so as to determine whether a defect is present or not by a margin percentage range.

Discussion of the Background

In general, Multi Layer Ceramic Capacitor (MLCC) chips are key components for controlling electric current to flow constantly in circuits of electronic products, and used in various fields of smart electronic devices in addition to automobiles.

Stack alignment inspection of such MLCC chips may include an inspection process after a stacking process.

Figure 9:
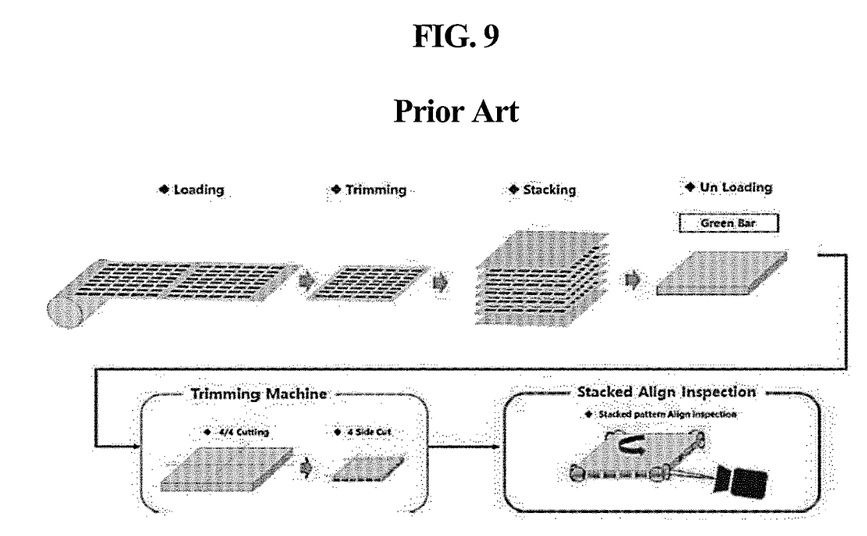
FIG. 9 is a view illustrating the entire process from MLCC stacking to inspection in the related art.

FIG. 9 is a view illustrating the entire process from stacking to inspection in the related art. The stacking is a process of stacking several hundred layers of dielectric sheets on which Ni electrodes in pattern units are printed, and a stacked product is called a green bar. Trimming is a process of dividing the green bar into four parts and additionally trimming four sides thereof to expose Ni electrode layers, so as to preparing for vision inspection available.

In addition, the inspection process is a process of usually capturing images of the total of eight points, that is, two points at each corner with a vision camera, and visually determining whether stack alignment is good or bad.

Figure 10:
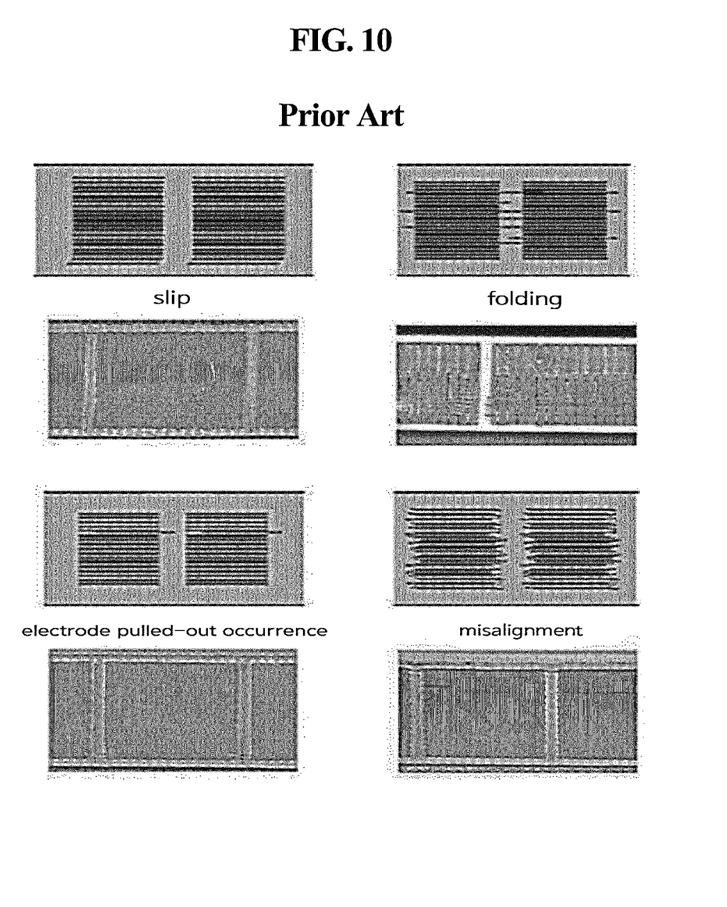
FIG. 10 is a view illustrating general MLCC inspection types.

In addition, referring to FIG. 10, the MLCC inspection may generally be performed by focusing on four types of stack alignment defects: alignment slip, sheet folding, electrode pulled-out occurrence, and misalignment.

However, a conventional inspection method has problems in that a Working Distance (WD) deviation occurs due to manually handling a green bar placed on an inspection stage, a uniform image is difficult to secure due to occurring of a Depth of Focus (DOF) range difference caused by an angle of a cutting plane, and an inhomogeneous photographing environment in which a camera, the inspection stage, and the like are not fixed is in need of improvement.

In addition, in determining a margin percentage with a captured image and determining the image as defective when the image is out of a margin percentage range, a deviation occurs between inspectors when to determine the margin percentage in the conventional inspection method. The cause of the deviation is because a threshold value is adjusted with the naked eye until a boundary between an electrode (in black) and a dielectric (in white) becomes clear in the captured image, and also visual evaluation dominates rather than numerical evaluation when a distance value between electrodes is measured by visually determining a highest point and a lowest point.

The above information disclosed in this Background section is only for understanding of the background of the inventive concepts, and, therefore, it may contain information that does not constitute prior art.

SUMMARY

In order to solve the above problems, Applicant recognized that research is required for a deep learning-based MLCC stacked alignment inspection system and a method thereof, wherein noise is removed through object recognition on an image and defect determination based on a margin percentage range is able to be improved through learning on defective data and normal data.

Accordingly, an objective of the present disclosure is to provide a deep learning-based MLCC stacked alignment inspection system and a method thereof, wherein core areas requiring inspection of image data captured from a semiconductor MLCC chip are detected in an image by using at least one deep learning-based core area detection model including an object recognition algorithm, segmentation is performed in the detected core areas, and a segmentation result is used, so as to determine whether a defect is present or not according to a standard margin percentage range, whereby noise is removed through object recognition on the image, and the defect determination by the margin percentage range may be improved through learning on bad data.

Another objective of the present disclosure is to provide a deep learning-based MLCC stacked alignment inspection system and a method thereof, wherein visualization is performed for respective results of the core area detection, the segmentation, and the defect detection by an integrated defect detection unit, and the visualization is provided, so as to determine whether to modify corresponding data or not through an inspector's analysis of the visualized stepwise analysis data, thereby making the system robust against errors upon detecting a defect.

Additional features of the inventive concepts will be set forth in the description which follows, and in part will be apparent from the description, or may be learned by practice of the inventive concepts.

According to an aspect of the invention, a deep learning-based MLCC stacked alignment inspection system, the system includes: an integrated defect detection unit configured to detect at least one core area requiring inspection of image data in which a stacked structure is photographed from a semiconductor MLCC chip by using at least one deep learning-based core area detection model, perform segmentation in the detected core areas, determine whether a defect is present or not according to a standard margin percentage range by using a segmentation result, and enable defect detection by generating normal data and/or defective data based on the determination result; a result analysis unit configured to perform visualization for respective results of the core area detection, segmentation, and defect detection of the integrated defect detection unit, and provide stepwise analysis data for the visualized respective results so as to determine whether to modify corresponding data or not; and a data storage configured to store the normal and/or defective data, and the stepwise analysis data.

In the system, the integrated defect detection unit may be configured to perform boundary surface segmentation by using a segmentation model for dividing a boundary surface for each class in a plurality of core areas detected by the core area detection model, measure a margin percentage for a straight-line distance between electrodes by using the segmentation result of each core area, and determine the margin percentage as normal when the measured margin percentage is within the preset standard margin percentage range and as defective when out of the standard margin percentage range.

In the system, the system may further include an annotation tool, as a program, configured to modify labeling for the stepwise analysis data requiring modification and obtained through result analysis via a visualization process by the result analysis unit.

In the system, the system may further include a self-learning unit configured to perform periodic learning in order to improve model performance on the normal and/or defective data generated by the integrated defect detection unit.

In the system, the system may further include a defective data generation unit configured to generate the defective data required for the learning through a model based on a generative adversarial neural network (GAN) in order to alleviate an imbalance between the normal data and the defective data.

According to another aspect of the invention, a deep learning-based MLCC stacked alignment inspection method, the method includes the steps of: extracting, by an integrated defect detection unit provided in a deep learning-based MLCC stacked alignment inspection system, core areas from semiconductor image data by using a pre-learned core area extraction model; classifying, by the integrated defect detection unit, inspection areas by using segmentation within the core areas; determining, by the integrated defect detection unit, whether a semiconductor chip is defective or not by comparing a margin percentage of each inspection area classified by the segmentation with a standard margin percentage; and generating, by a result analysis unit provided in a deep learning-based MLCC stacked alignment inspection system, analysis data by analyzing and visualizing a result for each process upon detecting a defect, and providing the analysis data so as to determine whether to perform modification or not.

In the method, the method may further include a step of storing, by the result analysis unit, normal data and defective data, which are generated when determining whether the defect is present or not, to the data storage for learning, in a case where modified data is generated from the stepwise analysis data visualized by using an annotation tool.

In the method, the method may further include a step of performing, by a self-learning unit provided in a deep learning-based MLCC stacked alignment inspection system, self-learning by using the normal data, the defective data, and the modified data, improving prediction accuracy of a model used upon detecting the defect, and reflecting updates performed periodically for optimization.

The deep learning-based MLCC stacked alignment inspection system of the present disclosure has a strong point in that core areas requiring inspection of image data captured from a semiconductor MLCC chip are detected in an image by using at least one deep learning-based core area detection model including an object recognition algorithm, segmentation is performed in the detected core areas, and a segmentation result is used, so as to determine whether a defect is present or not according to a standard margin percentage range, whereby on the basis of deep learning, noise is removed through object recognition on the image, and defect determination by the margin percentage range may be improved through learning on bad data.

In addition, the present disclosure has another strong point in that visualization is performed for respective results of the core area detection, the segmentation, and the defect detection, and the visualization is provided, so as to determine whether to modify corresponding data or not through an inspector's analysis of the visualized stepwise analysis data, thereby making the system robust against errors upon detecting a defect.

In addition, periodic self-learning is performed so that a defect is better detected when a certain amount of the model results, the generated defective data, and the modified data are accumulated because the conventional model used upon detecting a defect is a model learned with small amount of data, whereby performance improvement and parameter optimization of the above-described prediction models (i.e., a core area extraction model, a segmentation model, a defect detection model, etc.) may be achieved.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a specific exemplary embodiment of the present disclosure will be described in detail with reference to the drawings. However, the idea of the present disclosure is not limited to the presented exemplary embodiment, and through addition, change, deletion, and the like of other components within the scope of the same idea, those skilled in the art who understand the idea of the present disclosure may easily propose other exemplary embodiments included within the scope of the present disclosure or other disclosures that are retrogressive, but such other exemplary embodiments will also be included within the scope of the disclosure. In addition, components having the same function within the scope of the same idea shown in the drawings of each exemplary embodiment will be described using the same reference numerals.

Figure 1:
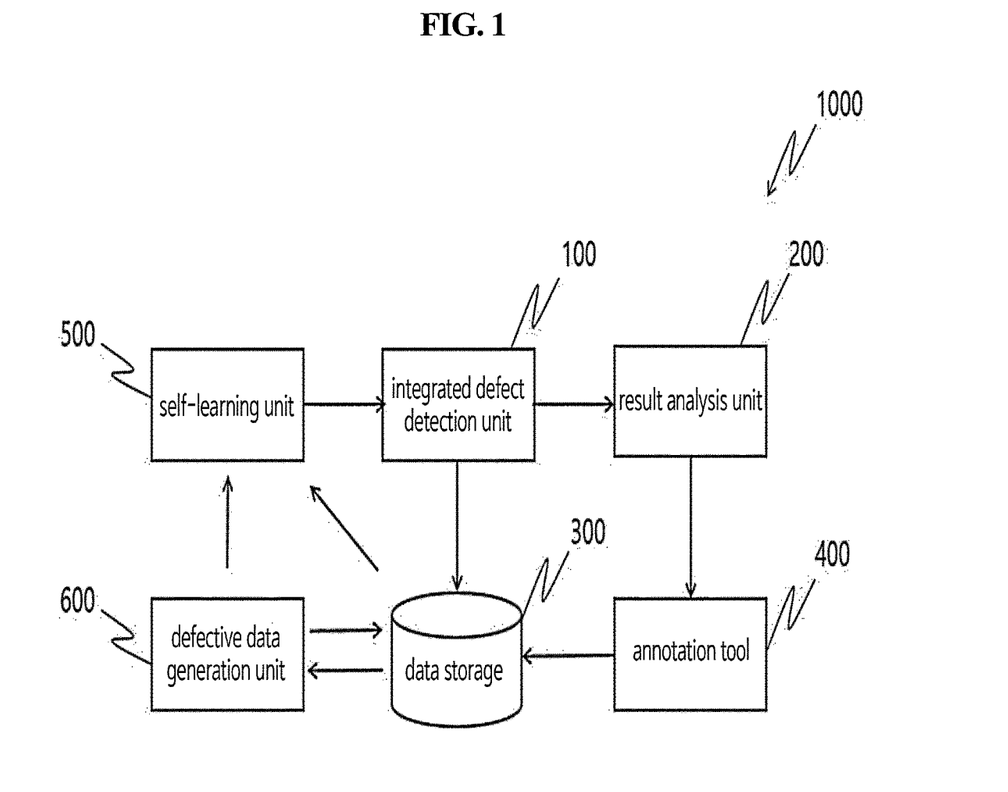
FIG. 1 is a block diagram illustrating a configuration of a deep learning-based MLCC stacked alignment inspection system according to an exemplary embodiment of the present disclosure.

A deep learning-based MLCC stacked alignment inspection system 1000 of the present disclosure is a system for MLCC stacked defect inspection, and as shown in FIG. 1, in order to perform specific functions, the system includes an integrated defect detection unit 100, a result analysis unit 200, a data storage 300, an annotation tool 400, a self-learning unit 500, and a defective data generation unit 600.

Figure 2:
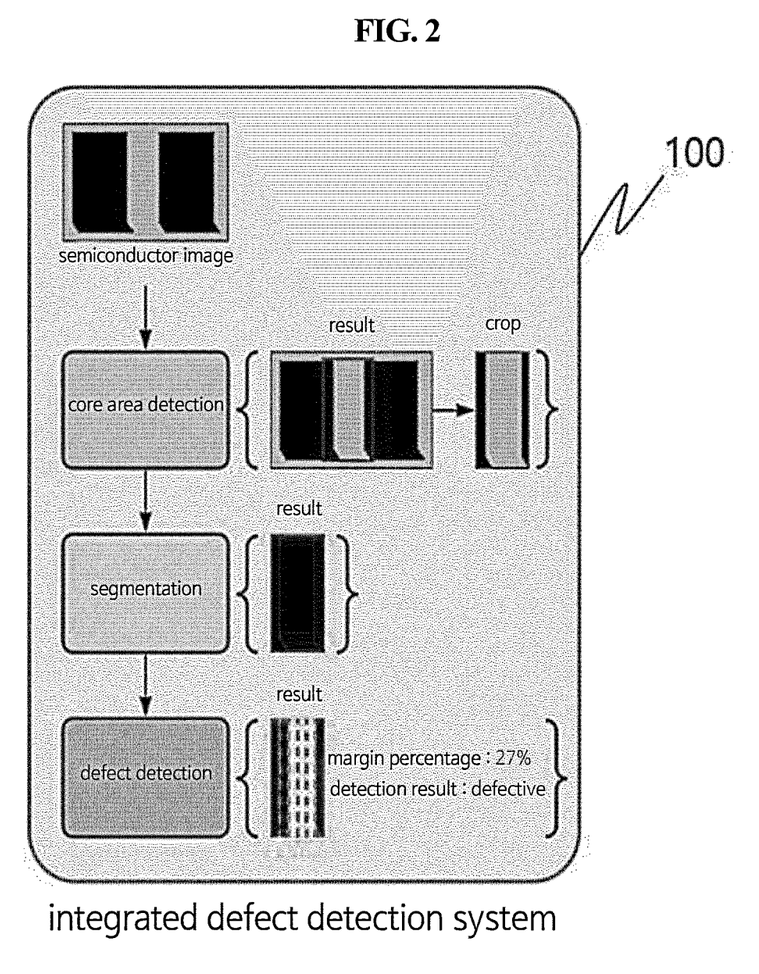
FIG. 2 is a view illustrating detailed functions of an integrated defect detection unit of FIG. 1.

As shown in FIG. 2, the integrated defect detection unit 100 may allow defect detection by performing, step by step, a core area detection function for core areas requiring inspection of image data captured from a semiconductor MLCC chip, a segmentation function, and a defect detection function.

First, the core area detection function detects core areas in an image by using at least one core area detection model capable of determining whether semiconductor image data is defective or not.

The model used here may be applied to any detection model based on deep learning including an object recognition algorithm, and a detection result of the model may be box coordinates of each predicted core area. In addition, the core areas may be image areas captured for an MLCC stacked structure requiring inspection.

Here, the object recognition algorithm or deep learning-based detection model may be a Convolutional Neural Network (CNN) algorithm and a Transformer algorithm. Here, the CNN algorithm is a neural network algorithm for recognizing an object through a convolution operation, and the Transformer algorithm is an algorithm for composing an image in a sequence form and capable of detecting global significance by using multi-head attention.

In addition, the present disclosure may also use a Region-based CNN (R-CNN) algorithm or a Detection Transformer (DETR), which utilize a deep learning object recognition method to be particularly excellent in detecting an object position, so as to recognize an object.

The R-CNN algorithm is a neural network algorithm for first generating candidate regions and training a CNN on the basis of these candidate regions to find a position of an object in an image. The object recognition process includes: a process of generating each candidate region by using a selective search in an input image; a process of converting each generated candidate region to have a same size and extracting features through a CNN; and a process of classifying a position and class of an object in the candidate region by inputting the extracted features to fully-connected layers.

In this case, because of the inaccurate positions of the candidate regions, a position and class of an object area box may be ultimately and accurately corrected through a regression learning module and a class classification module.

In addition, the Detection Transformer algorithm includes: a process of first composing an image in a sequence form and passing the image through a Transformer Encoder to create an embedding well containing image information; and a process of accurately classifying a position of an actual object and a class of the object by additionally configuring a Transformer Decoder and reusing the embedding, which is a result of the Transformer Encoder, in the Decoder.

In addition, the Encoder may capture high-quality features for the image by using multi-head attention capable of supporting learning by checking significance between sequences in the creating of the embedding well containing the image information, and may also maximally reduce redundancy to accurately correct the position and class of the object by using a Hungarian algorithm and binary matching without using a Non-Maximum Suppression (NMS) method unlike in the related art in the classifying of the position and class of the object.

In addition, other neural network algorithms include Fast R-CNN, R-FCN, You only Look Once (YOLO), Single Shot MultiBox Detector (SSD), etc. The above-described neural network algorithms may be applied additionally, or may be applied in place of R-CNN. Object recognition speed may also be improved by applying an algorithm corresponding to a one-stage algorithm among the above-described neural network algorithms.

Further, in order to increase object recognition rates, algorithms such as AdaBoost, Support Vector Machine (SVM), Linear Discriminant Analysis (LDA), Principal Component Analysis (PCA), and the like may be additionally used. All of such algorithmic techniques identify a recognition target area on the basis of appearance. In this regard, areas around an object (e.g., image areas for an MLCC stacked structure corresponding to core areas) are detected by using a model trained by a set of video images to be used for training and various surrounding constraints are overcome through the training, and thus, as a result, all the algorithmic techniques may enable the system and method of the present disclosure to be robust against image noise (i.e., defective pixels, etc.) and to increase object recognition accuracy and reliability.

In addition, the segmentation function may perform boundary surface segmentation by utilizing a segmentation model for dividing a boundary surface for each class in a plurality of core areas detected by the core area detection model. That is, here, the boundary surfaces may correspond to one or more inspection areas requiring defect detection within each core area.

In addition, any segmentation model based on an algorithm or deep learning may be applicable to the segmentation model, and a detection result of this segmentation model may be classes of respective pixels existing in the predicted core areas.

In addition, the integrated defect detection unit 100 may perform a defect detection function of measuring a margin percentage for a straight-line distance between electrodes by using the segmentation result of the core areas.

A standard margin percentage for comparing a measured margin percentage may be set individually for each piece of semiconductor image data. In a margin percentage range measured by using a set standard margin percentage as a reference point, when the margin percentage range is within the standard margin percentage range, it may be determined as normal, and when the margin percentage range is out of the standard margin percentage range, it may be determined as defective. Here, a straight-line distance range of the standard margin percentage may include, for example, a distance between each electrode pattern in the MLCC stacked structure.

Figure 11:
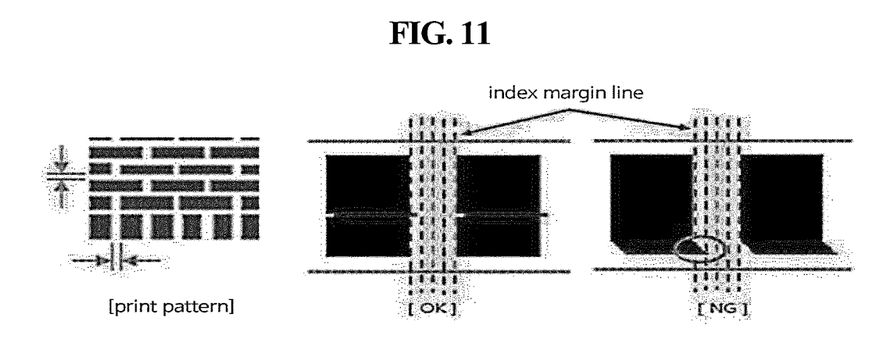
FIG. 11 is a view describing an example of margin percentage determination in the present disclosure.

More specifically, referring to FIG. 11 as an example, margin percentage determination is performed by dividing a distance between electrodes (i.e., a margin section) in a printed pattern into four parts with captured image data, whereby the captured image data is determined to be defective when an electrode exceeds a standard margin percentage of ¼ (i.e., 25%) (refers to a green circle), which is corresponding to a margin part of the electrode, and is determined to be normal when an electrode is within the standard margin percentage of ¼.

Figure 3:
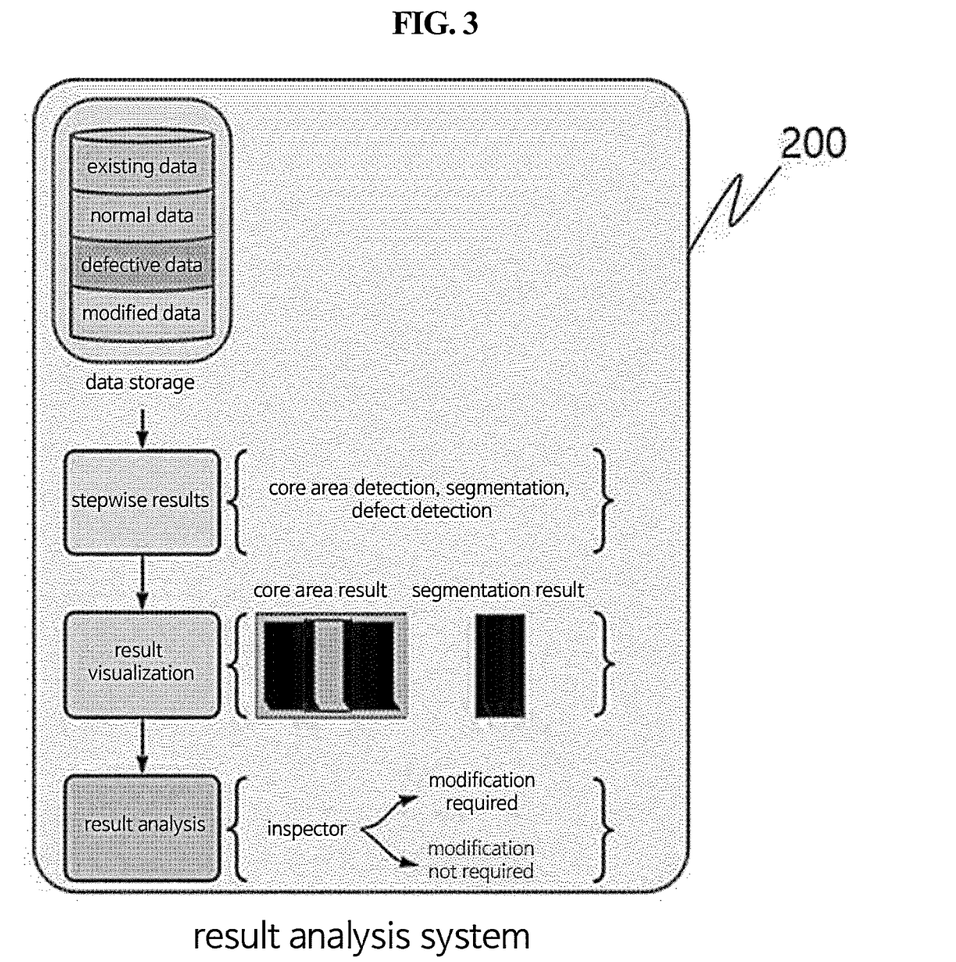
FIG. 3 is a view illustrating detailed functions of a result analysis unit of FIG. 1.

Referring to FIG. 3, the result analysis unit may perform a function of analyzing and converting data so that the stepwise result of the integrated defect detection unit 100 is visualized after preprocessing, and is provided to be seen with the naked eyes.

In addition, the result analysis unit may also select data (i.e., existing, normal, defective, and modified data) in the data storage 300 to perform result visualization.

In addition, the result analysis unit provides the data processed with the result visualization to an inspector, and enables the inspector to determine whether to modify a result predicted by the model or not through the visualized stepwise result.

That is, the result analysis unit performs the visualization for respective results of the core area detection, the segmentation, and the defect detection, which are the functional steps of the integrated defect detection unit 100, and enables the inspector to directly check the resultant analysis data for each step and to determine whether modification is required or not.

Figure 5:
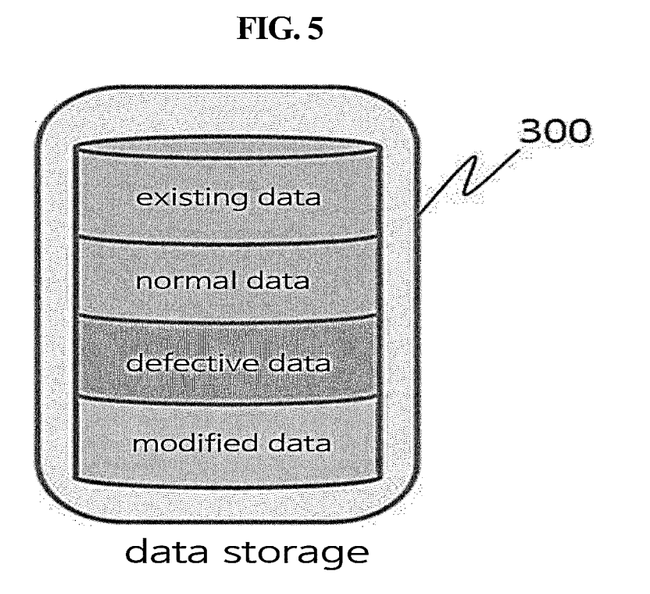
FIG. 5 is a view illustrating detailed functions of a data storage of FIG. 1.

Referring to FIG. 5, the data storage 300 serves as a database in which the normal data and defective data, which are calculated through the integrated defect detection unit 100, are stored and managed along with existing data.

In addition, the data storage 300 may additionally store the modified data that is modified through the annotation tool 400 to be described later.

In addition, here, various data stored in the data storage 300 is organized with image files (e.g., *.jpg, *.png, etc.) and labeling files corresponding to respective images. The resultant analysis data and defective data, which are visualized by the result analysis unit 200, may be used for self-learning through the self-learning unit 500 to be described later.

In addition, the existing data is data pre-learned by the self-learning unit 500, and may be normal data or defective data, which are generated by the integrated defect detection unit 100 in the past, and when there is no normal and/or defective data in the beginning, for prior learning, initial normal data of an MLCC chip model at the time of shipment and defective data randomly generated by the defective data generating unit 600 may be the respective normal and defective data in the beginning.

Figure 4:
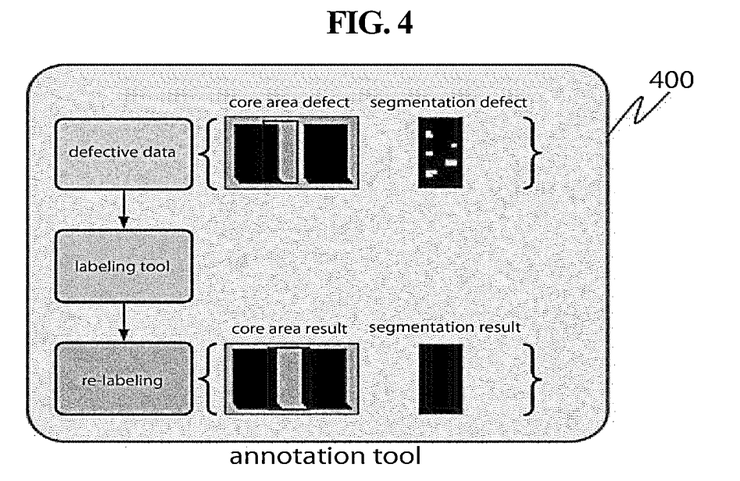
FIG. 4 is a view illustrating detailed functions of an annotation tool of FIG. 1.

Referring to FIG. 4, the annotation tool 400 is a tool (i.e., a program tool) for re-labeling by modifying labeling for the stepwise analysis data requiring modification and obtained through the result analysis via the visualization process by the result analysis unit 200.

In this case, the labeling supports both of the core area function and the segmentation function. The re-labeling is performed by modifying the stepwise analysis data requiring modification through the annotation tool 400 for web-based labeling modification. The modified data may be stored in the data storage 300 to be used for self-learning. In addition, such an annotation tool 400 may be installed in a form OF program in an administrator terminal possessed by an inspector, or in the result analysis unit 200.

Figure 6:
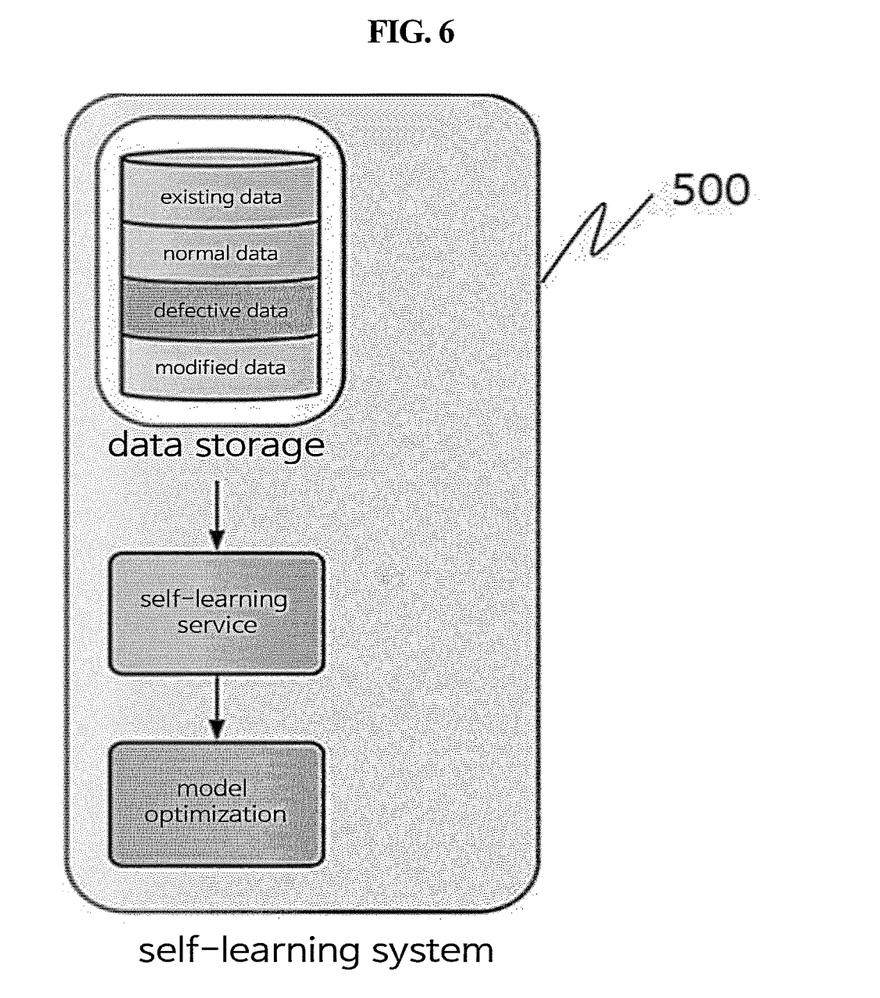
FIG. 6 is a view illustrating detailed functions of a self-learning unit of FIG. 1.

Referring to FIG. 6, the self-learning unit 500 may perform periodic self-learning in order to achieve performance improvement and parameter optimization of the above-described prediction models (i.e., the core area extraction model, segmentation model, defect detection model, etc.) so that defects are better detected when a certain amount of the model results, generated defective data, and modified data are accumulated because the conventional models are models learned with the small amount of data due to the difficulty in collecting semiconductor data.

In addition, the self-learning unit 500 provides a web-based and deep learning-based learning service so that even non-experts may use deep learning algorithm-based self-learning, perform the self-learning by setting values required for the learning, such as selecting a model among existing models and setting parameters, through a web-based User Interface (UI), and may automatically update the model when the learning is finished and set the model as a fundamental learning model.

In addition, to proceed with the prior learning, the self-learning unit 500 may be provided with initial data for prior learning that is a basis for respective models by step (i.e., a core area extraction model, segmentation model, defect detection model, etc.) used in the integrated defect detection unit. As described above, the initial normal data of the MLCC chip model at the time of shipment and the defective data randomly generated by the defective data generating unit 600 may be the initial data.

Figure 7:
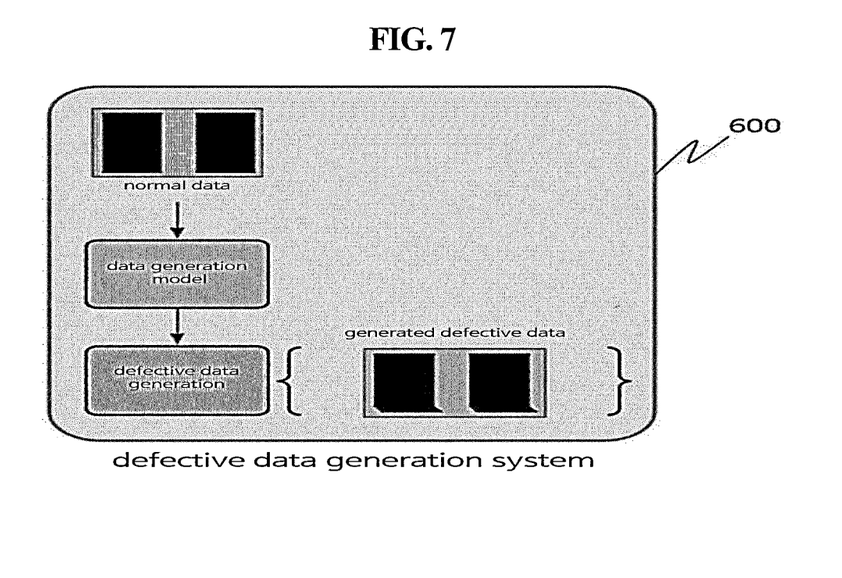
FIG. 7 is a view illustrating detailed functions of a defective data generation unit of FIG. 1.

Referring to FIG. 7, the defective data generation unit 600 may generate defective data in order to alleviate an imbalance because an occurrence rate of the defective data is very low in an actual semiconductor process, resulting in the imbalance between normal data and defective data.

Specifically, the defective data generation unit 600 may extract normal data from the data storage 300 and generate defective data through a model based on a generative adversarial neural network (GAN), and the generated defective data may be stored in the data storage 300 as the defective data to be used for learning.

Here, the generative adversarial neural network (GAN) has a structure configured with multiple deep neural networks, unlike conventional deep learning networks, and requires dozens of times more computation than those of the conventional deep neural network models in order to generate high-resolution images, but may provide excellent performance for image restoration and image generation.

The generative adversarial neural network is an unsupervised learning-based generative model for performing adversarial training for two networks by using a generator and discriminator. The generator may be input with input data and may be trained to generate a fake image (i.e., defective data image of the present disclosure) similar to a real image.

Noise values may be input to the input data. The noise values may follow any probability distribution. For example, the input data may be data generated with a zero-mean Gaussian.

The discriminator may learn so as to discriminate a real image from a fake image generated by the generator. More specifically, the learning may be performed to have a high probability when the real image is input, and to have a low probability when the fake image is input That is, the discriminator may gradually learn so as to well discriminate the real image from the fake image.

Figure 8:
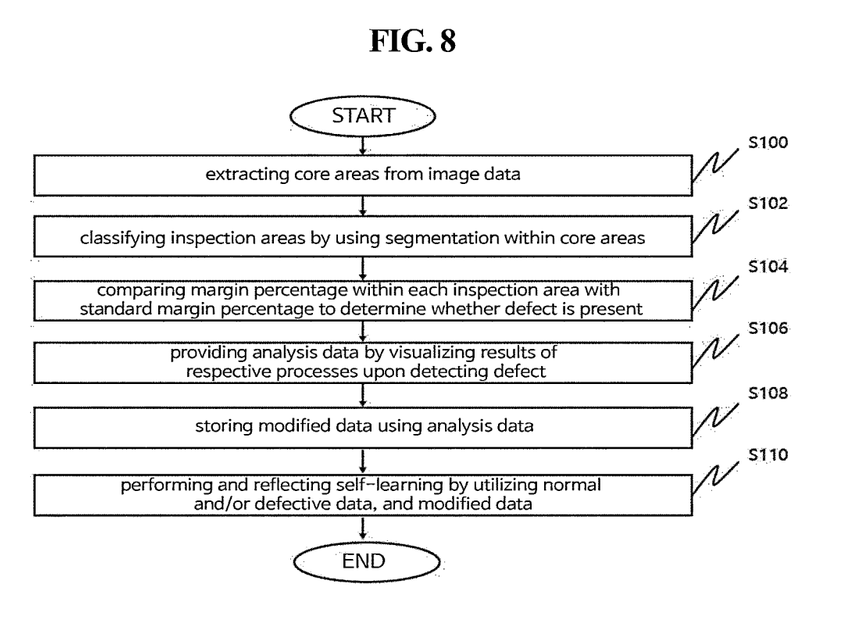
FIG. 8 is a flowchart of a deep learning-based MLCC stacked alignment inspection method according to the exemplary embodiment of the present disclosure.

FIG. 8 is a flowchart of a deep learning-based MLCC stacked alignment inspection method according to the exemplary embodiment of the present disclosure.

First, in step S100, an integrated defect detection unit 100 provided in a deep learning-based MLCC stacked alignment inspection system 1000 may extract core areas by using a core area extraction model pre-learned from semiconductor image data.

Next, in step S102, the integrated defect detection unit 100 may classify inspection areas by using segmentation within the core areas.

In addition, in step S104, the integrated defect detection unit 100 may determine whether a semiconductor chip (i.e., an MLCC chip) is defective or not by comparing a margin percentage in each inspection area classified by the segmentation with a standard margin percentage.

In addition, in step S106, upon detecting a defect, a result analysis unit 200 may analyze and visualize a result for each process, generate analysis data, and provide the analysis data to an inspector to determine whether to perform modification or not.

In addition, in step S108, in a case where modified data is generated from stepwise analysis data visualized by using an annotation tool 400, the result analysis unit 200 stores the modified data together with normal data and defective data, which are generated when determining whether a defect is present or not, to a data storage 300 for learning.

In step S110, a self-learning unit 500 performs self-learning by using the normal data, defective data, and modified data, improves prediction accuracy of the model used upon detecting the defect, and reflects updates performed periodically for optimization.

As a result, the more accumulated existing data (i.e., past data), normal/defective data, and modified data, the better the performance of the model through the learning. Therefore, the prediction accuracy is improved and variable optimization is achieved, thereby ultimately increasing the defect detection performance.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A deep learning-based multilayer ceramic capacitor (MLCC) stacked alignment inspection system, the system comprising:
    an integrated defect detection unit configured to: detect core areas requiring inspection of image data in which a stacked structure is photographed from a semiconductor MLCC chip by using at least one deep learning-based core area detection model, perform segmentation in the detected core areas, determine whether a defect is present or not according to a standard margin percentage range by using a segmentation result, and detect normal data and/or defective data based on a determination result;
    a result analysis unit configured to: perform visualization for respective results of the core area detection, segmentation, and defect detection of the integrated defect detection unit, and provide stepwise analysis data for the visualized respective results so as to determine whether to modify corresponding data or not; and
    a data storage configured to store the normal and/or defective data, and the stepwise analysis data.

2. The system of claim 1, wherein:
    the segmentation performed in the detected core areas comprises boundary surface segmentation using a segmentation model for dividing a boundary surface for each class in a plurality of core areas detected by the core area detection model; and
    the integrated defect detection unit performs defect detection by measuring a margin percentage for a straight-line distance between electrode patterns by using the segmentation result of each core area, and determining the margin percentage as normal when the measured margin percentage is within the preset standard margin percentage range and as defective when out of the standard margin percentage range.

3. The system of claim 2, further comprising:
    an annotation tool, as a program, configured to modify labeling for the stepwise analysis data requiring modification and obtained through result analysis via a visualization process by the result analysis unit.

4. The system of claim 2, further comprising:
    a self-learning unit configured to perform periodic learning in order to improve model performance on the normal and/or defective data generated by the integrated defect detection unit.

5. The system of claim 4, further comprising:
    a defective data generation unit configured to generate the defective data required for the learning through a model based on a generative adversarial neural network (GAN) in order to alleviate an imbalance between the normal data and the defective data.

6. A deep learning-based multilayer ceramic capacitor (MLCC) stacked alignment inspection method, the method comprising the steps of:
    extracting, by an integrated defect detection unit provided in a deep learning-based MLCC stacked alignment inspection system, core areas from semiconductor image data by using a pre-learned core area extraction model;
    classifying, by the integrated defect detection unit, inspection areas by using segmentation within the core areas;
    determining, by the integrated defect detection unit, whether a semiconductor chip is defective or not by comparing a margin percentage of each inspection area classified by the segmentation with a standard margin percentage; and
    generating, by a result analysis unit provided in the deep learning-based MLCC stacked alignment inspection system, analysis data by analyzing and visualizing a result for each of the extracting, classifying, and determining steps upon detecting a defect, and providing the analysis data so as to determine whether to perform modification or not.

7. The method of claim 6, further comprising a step of:
    storing, by the result analysis unit, normal data and defective data, which are generated when determining whether the defect is present or not, to a data storage for learning, in a case where modified data is generated from stepwise analysis data visualized by using an annotation tool.

8. The method of claim 7, further comprising a step of:
    performing, by a self-learning unit provided in the deep learning-based MLCC stacked alignment inspection system, self-learning by using the normal data, the defective data, and the modified data, improving prediction accuracy of a model used upon detecting the defect, and reflecting updates performed periodically for optimization.

\* \* \* \* \*